United States Patent
Sanchez

(10) Patent No.: US 11,763,152 B2
(45) Date of Patent: *Sep. 19, 2023

(54) SYSTEM AND METHOD OF IMPROVING COMPRESSION OF PREDICTIVE MODELS

(71) Applicant: BlueOwl, LLC, San Francisco, CA (US)

(72) Inventor: Kenneth J. Sanchez, San Francisco, CA (US)

(73) Assignee: BlueOwl, LLC, San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/820,268

(22) Filed: Aug. 17, 2022

(65) Prior Publication Data

US 2022/0391703 A1   Dec. 8, 2022

Related U.S. Application Data

(63) Continuation of application No. 16/114,894, filed on Aug. 28, 2018, now Pat. No. 11,455,524.

(60) Provisional application No. 62/551,662, filed on Aug. 29, 2017.

(51) Int. Cl.
| | |
|---|---|
| *H03M 7/00* | (2006.01) |
| *G06N 3/08* | (2023.01) |
| *H03M 7/30* | (2006.01) |
| *G06F 16/904* | (2019.01) |
| *G06F 18/214* | (2023.01) |
| *G06N 3/086* | (2023.01) |
| *G06N 3/10* | (2006.01) |
| *G06N 3/043* | (2023.01) |

(52) U.S. Cl.
CPC ............ *G06N 3/08* (2013.01); *G06F 16/904* (2019.01); *G06F 18/2155* (2023.01); *H03M 7/60* (2013.01); *G06N 3/043* (2023.01); *G06N 3/086* (2013.01); *G06N 3/10* (2013.01); *G06N 3/105* (2013.01)

(58) Field of Classification Search
CPC ........ G06N 3/08; G06N 3/0436; G06N 3/086; G06N 3/10; G06N 3/105; G06F 16/904; G06K 9/6259; H03M 7/60
See application file for complete search history.

(56) References Cited

U.S. PATENT DOCUMENTS

| | | | |
|---|---|---|---|
| 7,318,051 B2 * | 1/2008 | Weston | ............... G06K 9/6269 706/12 |
| 10,275,690 B2 | 4/2019 | Chen et al. | |
| 10,846,308 B2 * | 11/2020 | Miller | .................... G06N 20/00 |
| 2005/0216426 A1 * | 9/2005 | Weston | ................ G06K 9/6231 706/12 |
| 2008/0215513 A1 * | 9/2008 | Weston | .................. G06N 20/10 706/13 |
| 2018/0053071 A1 | 2/2018 | Chen et al. | |
| 2019/0244113 A1 * | 8/2019 | Ramos | ..................... G06N 3/08 |

* cited by examiner

*Primary Examiner* — Jean B Jeanglaude
(74) *Attorney, Agent, or Firm* — Faegre Drinker Biddle & Reath LLP

(57) ABSTRACT

A computer-implemented method for improving compression of predictive models includes generating an unlabeled simulated data set by expanding an initial data set, and generating a labeled data set by predicting the unlabeled, simulated data set using a complex model to output a plurality of labels. The method also includes training a relatively simple neural network using the labeled data set.

20 Claims, 5 Drawing Sheets

SYSTEM AND METHOD OF IMPROVING COMPRESSION OF PREDICTIVE MODELS

This application is a continuation of U.S. patent application Ser. No. 16/114,894, filed Aug. 28, 2018, which claims priority to U.S. Provisional Patent Application No. 62/551,662, filed Aug. 29, 2017, both of which are incorporated by reference herein for all purposes.

FIELD OF THE DISCLOSURE

The present disclosure is directed to improving compression of predictive models and, more specifically, to techniques for training a compressed model to faithfully reproduce the predictive capabilities of a complex model that predicts at least one variable of interest.

BACKGROUND

In various applications a need exists to build a complex predictive model using input data. Predictive models generally accept data, known as "observations" and/or "features," that are used as inputs to make predictions. For example, a complex model may be trained that accepts input parameters about a person (e.g., the person's education, age, years of job experience, etc.) and outputs a prediction of the person's income. Complex predictive models suffer from three principal drawbacks: opacity, brittleness, and storage inefficiency.

First, complex predictive models are generally opaque structures. They may be comprised of multiple, linked sub-models that are associated with multiple input parameters and outputs. The input parameters may be transformed via numerous mathematical transformations, such as mean centering or principal component analysis, etc. Input parameters may be converted, within a particular layer of a model, to other factors via various algorithms and techniques, such as random forests, boosted trees, support vector machines, regression models, and neural networks. These converted factors may, in turn, be passed to subsequent models. A complex model may include many (e.g., one hundred or more) independently-tuned models, and while each sub-model may be understandable and readily optimized in isolation, the sub-models may create intractable complexity when combined with other sub-models. Although complex models with multiple sub-models are discussed in the foregoing, it should be understood that a complex model may be a single, unitary model. That is, the number of distinct models comprising a system and/or the presence of sub-models in a system may be indicia of complex models, but are not necessary features. The distinguishing features of a simple (i.e., compressed) model are generally smaller size, improved comprehensibility, and/or greater ease of modification (such as by the adjustment of training parameters, as discussed herein).

In general, input parameters are the observations and/or facts that are input to a compressed model, and training parameters are parameters that can be adjusted during the training process and affect the functioning of the trained, compressed model (e.g., weights pertaining to respective input parameter(s) or intermediate variables). Both input parameters and training parameters may be associated with primitive or complex data types, as discussed herein.

The aforementioned linkages and transformations allow complex models to make sophisticated and accurate predictions, but at a cost of comprehensibility. Each sub-model of a complex model may be independently comprehensible to a person of ordinary skill, but upon combination even in small numbers may be exceptionally difficult or impossible for even the most highly-skilled experts, including the model designer(s), to understand and/or explain. Further, while machine learning practitioners are adept at optimizing complex models, they often struggle to understand and/or explain the emergent behavior and/or predictions of complex models once those models have been trained.

The opacity of complex machine learning models has other real-world consequences. For example, in regulated industries, models that cannot readily be explained in terms comprehensible to a human may be of limited to no value, regardless of the predictive accuracy of such models. However, it should be noted that despite the inherent complexity of a predictive model comprised of many sub-models, the result of the predictive model may be surprisingly simple, such as a single number or a boolean (e.g., "TRUE" or "FALSE") value.

Second, complex predictive models are generally brittle structures. As discussed above, there can be a high degree of linkage between the individual sub-models of a complex model, and the inputs and outputs of the respective sub-models may be interdependent. Therefore, changing one sub-model may require changes to neighboring sub-models, which may cause cascading incompatibilities to further, neighboring sub-models. Updating a deployed complex model incrementally may be exceptionally difficult or impossible.

Third, complex predictive models are generally storage inefficient. A complex model comprising many sub-models may require code and data for each sub-model to function. This can result in complex models whose aggregate storage requirements are on the order of gigabytes or terabytes of data. Such complex models are impractical in many use cases, such as use cases in which the models reside in mobile computing environments with very limited memory. And if, as discussed above, incremental updates are not possible, redundant copying of large amounts of data may limit the usefulness of the models.

While compressing a complex model using conventional techniques may avoid some of these difficulties, the resulting, compressed model would typically have far worse predictive accuracy, and/or would require far more labeled training data than can readily be made available. Accordingly, there exists a need for systems and methods capable of compressing complex predictive models into a compressed, storage efficient model that can be easily explained and incrementally updated, while retaining a high degree of accuracy.

BRIEF SUMMARY

In one aspect, a computer-implemented method for improving compression of predictive models includes generating an unlabeled simulated data set by expanding an initial data set. The initial data set includes a first plurality of fact sets and the unlabeled simulated data set includes a second plurality of fact sets. The method further includes generating a first labeled data set, at least by predicting the unlabeled simulated data set using a complex model to output a plurality of labels. The labeled data set includes the second plurality of fact sets and the plurality of labels, and each of the second plurality of fact sets corresponds to a respective one of the plurality of labels. The method further includes training, using the labeled data set, a neural network model associated with a plurality of training parameters. Training the neural network model includes generating a plurality of intermediate predictions, at least by predicting the second plurality of fact sets using the neural network model, comparing the plurality of labels to the plurality of intermediate predictions to produce a measure of accuracy, and modifying, based on the measure of accuracy, at least one of the plurality of training parameters of the neural network model.

In another aspect a computing system comprising one or more processors and one or more memories storing instructions is provided. When the instructions are executed by the one or more processors, they cause the computing system to generate an unlabeled simulated data set by expanding an initial data set, wherein the initial data set includes a first plurality of fact sets and wherein the unlabeled simulated data set includes a second plurality of fact sets, The instructions further cause the computing system to generate a labeled data set, at least by predicting the unlabeled simulated data set using a complex model to output a plurality of labels, wherein the labeled data set includes the second plurality of fact sets and the plurality of labels, and wherein each of the second plurality of fact sets corresponds to a respective one of the plurality of labels, and train, using the labeled data set, a neural network model associated with a plurality of training parameters. Training the neural network model includes (i) generating a plurality of intermediate predictions, at least by predicting the second plurality of fact sets using the neural network model, (ii) comparing the plurality of labels to the plurality of intermediate predictions to produce a measure of accuracy, and (iii) modifying, based on the measure of accuracy, at least one of the plurality of training parameters of the neural network model.

DETAILED DESCRIPTION

Figure 1:
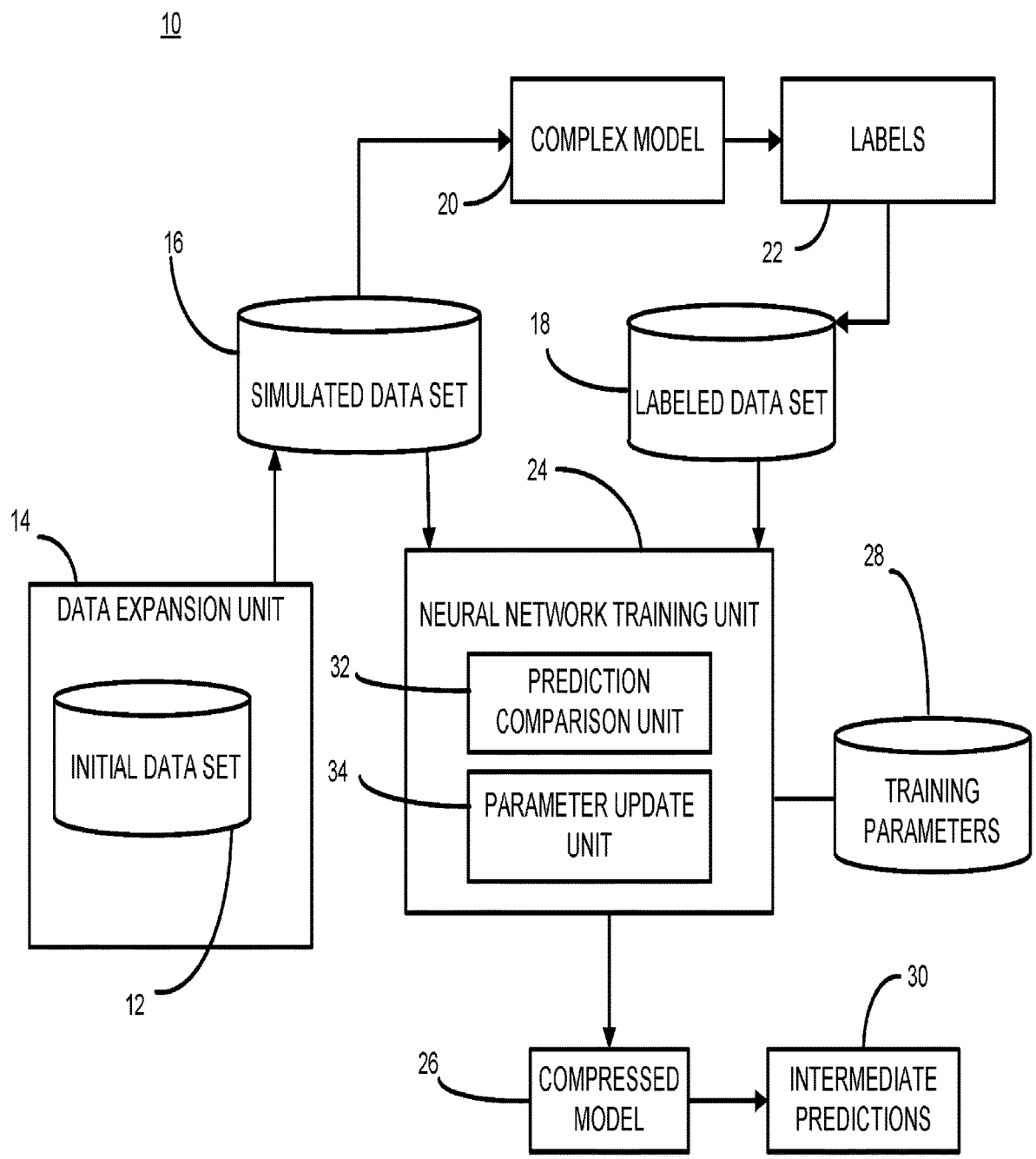
FIG. 1 is a data flow diagram depicting an example process for compressing predictive models, according to an embodiment.

The embodiments described herein relate to, inter alia, compressing complex predictive models (each comprising, e.g., one or more neural networks and/or other predictive models) into simpler, compressed models that may produce identical or approximately equivalent predictions. More specifically, in some embodiments, machine learning techniques are used to train a compressed model to faithfully reproduce or closely approximate the results of an existing complex predictive model. Given a pre-existing complex model of arbitrary complexity that may accept multiple input parameters and perform recursive or successive transformations thereof, and that produces one or more output variables, the compressed model is trained to predict the variable(s) of interest with a high—and in some embodiments configurable—degree of accuracy.

For example, a complex model may be constructed that uses a number of input variables to predict a person's income. The input variables may include the individual's education attainment level, age, years of work experience, field of study, city or state of residence, and so forth. The complex model may comprise multiple networked layers, each of which operates on inputs in successive order. The complex model may be trained using labeled training data that is based on information pertaining to real people, for example, and may predict income in a way that is verifiably highly accurate. In some embodiments, the complex model, or one or more sub-models thereof, is/are trained using unsupervised learning techniques.

In an embodiment, a generative algorithm may be used to create a second, simulated data set, which may in some instances follow the same or a similar distribution as the real data used to train the complex model. If the simulated data set comprises simulated facts pertaining to simulated/hypothetical people, for example, each respective fact may fit a distribution that is consistent with the distribution of facts pertaining to real people that were used to train the complex model. For example, the distribution of ages between the "real people facts" and "simulated people facts" may be identical or nearly identical. The simulated data set may be so consistent with the real data that no model is capable of determining which data set is real, and which is simulated, for example. However, the simulated data set may be of an arbitrarily large size, e.g., much larger than the real data set. In some alternative embodiments and/or scenarios, the simulated data set may purposely have a different distribution than the real data set, at least with respect to certain facts or certain fact combinations. For example, the simulated data set may be accentuated with a larger number of "edge cases" with rare or atypical fact combinations.

Next, the simulated data set may be passed as inputs into the complex model, and the predictions output by the complex model may be collected and used as labels for the fact sets of the simulated data set (e.g., with each fact set corresponding to a different hypothetical person). Finally, in some embodiments, a deep learning algorithm may be used to train a compressed model, using as inputs the now-labeled simulated data set. Specifically, the fact sets of the labeled data set may be analyzed for training purposes. In some embodiments, the deep learning algorithm used to train the compressed model has the property of infinite expressivity, indicating that an infinite number of training parameters may theoretically be provided to adjust the compressed model. In some embodiments, as the number of training parameters increases, and as the size of the labeled, simulated data set increases, so does the ability of the compressed model to accurately emulate the predictive capabilities of the complex model. By iteratively tuning the training parameters, the deep learning algorithm may arrive at the correct settings to approximate, with arbitrary precision, the complex model.

In addition to iteratively tuning the training parameters, the compressed model may be trained in an incremental, or "online", fashion. For example, a simulated data set comprising one trillion fact sets may be used, by generating labels with the complex model, and the compressed model, then comparing the output of the two models. This incremental training may be done, for example, using 1000 fact sets at a time until all one trillion fact sets are predicted, or until the desired precision is met, which may occur prior to all one trillion facts sets being considered. In an embodiment, the one trillion examples may already exist, or may be simulated on-demand (e.g., one million at a time, as needed). In some embodiments the compressed model may be used to make predictions before the training of the compressed model is complete, while refinement of the model is still underway.

In some embodiments, the compressed model produced through this process of model compression may be dramatically smaller in size than the original, complex model, without suffering a large (or possibly any) degradation in predictive accuracy. Numerous benefits may arise from this efficiency. First, the resulting model may be architecturally simpler and have fewer "moving parts." Whereas a complex model may make use of multiple chained-together systems, processes, data sinks and sources, a compressed model may be unitary, or comprise only a small number of separate components. Second, the details of the compressed model may be easily describable. In some applications, a predictive model that can be described by a human is beneficial. For instance, no customer wants to be told that a decision affecting his or her eligibility or level of service was based upon an algorithm that is too complicated for anyone to explain, or merely because "the computer said so." Similarly, governments have begun to limit the circumstances in which algorithmic decision-making may be legally permissible, and some have acted to curtail or limit the circumstances in which automated measures can be used to affect individual user rights (see, for example, Article 22 of the EU General Data Protection Regulation, entitled "Automated Individual Decision-Making, Including Profiling").

A third potential benefit of a compressed predictive model that approximates a larger, more complex model (for example, a 500 Kb compressed model as opposed to a 50 GB complex model) may be that the compressed model can be used for tasks that were impractical using the complex model. To illustrate, the benefits of smaller size and fewer required computation resources may enable the use of powerful predictive modeling in many applications, such as the Internet of Things (IoT). For example, a compressed model may run on a device with very limited storage and/or computation power, such as a mobile electronic device (e.g., a smartphone or the like) without overly taxing the storage, battery, or bandwidth of the device. As another example, network throughput may be substantially reduced and/or eliminated. Whereas a complex model may require that a computing device transfer large amounts of data to a back-end server for processing, a compressed model may allow the device to process the data locally.

A further potential benefit of the techniques described herein is that a compressed model may be serialized and de-serialized using rapid and straightforward techniques that are not possible with an equivalent complex model having many inter-related parts. In some embodiments, the use of a compressed model may completely obviate the need for a network connection, and/or may operate in a more energy-efficient manner, e.g., if the compressed model uses optimized mathematical operations (such as matrix algebra) computed on the user device. Conversely, the equivalent complex model may consume a lot of I/O and processor resources due to the necessity of transferring data to and from a complex model located remotely from the user device for processing. Further, in some embodiments, a compressed model may be periodically refined and pushed, or downloaded, to end-user devices (in part or in whole) by an upstream provider with minimal network overhead, and/or used asynchronously of any associated upstream server components.

A fourth potential benefit of a compressed predictive model over that of a complex model is found in deployment and updating of the model architecture and/or the input and/or training parameters. Input parameters are generally finite, and known. In some embodiments, input parameters are read from a user device by a parameter capture unit. Moreover, in some embodiments, a compressed model may be remotely updated to change the number and/or type of input parameters. Similarly, a trained, compressed model may be deployed easily to a remote user device or other system, and training parameters added or updated remotely by, for example, a parameter update unit.

Deployment of a complex model with a large number of sub-models may be extremely complicated and resist automation. Further, updating the parameters of a complex model may require the excision or addition of model sub-layers that are dependent on the interfaces and designs of adjacent layers. Therefore, redeployment of the entire complex model may be necessary to propagate even the smallest changes. Conversely, in some embodiments disclosed herein, updating a compressed model may merely require updating a list of input and/or training parameters.

In some embodiments, the compressed model may utilize a theoretically infinite number of training parameters. Training parameter values may be stored in a separate storage system such as an electronic database, lookup table, hash table, or similar. In another embodiment, training parameter values may be stored alongside or within the model itself. In practice, with reference to the above-described examples pertaining to use of compressed predictive models on electronic user devices, it should be appreciated that training parameter values may accompany the compressed model as it is deployed to the electronic user device, or may be retrieved from a remote parameter storage engine, and/or may be updated (pushed, or downloaded) to the user device independent of the compressed model.

In general, training (and input) parameter values may comprise further parameter(s) that include multiple parameter(s) of different types. For example, a parameter value A may comprise a B parameter of type integer and a C parameter of type float, and a D parameter of type string, etc. Parameter values may be subject to validation by a parameter value validator unit.

FIG. 1 depicts an example process 10 for compressing predictive models, according to an embodiment. In the process 10, an initial data set 12 is expanded by a data expansion unit 14 to generate an unlabeled, simulated data set 16. The initial data set 12 may include a plurality (e.g., thousands, millions, etc.) of linear or hierarchical data items. As used herein, the term "data item" may generally refer to an electronic item or record representing a primitive and/or complex data type. For example, initial data may comprise integers, characters, strings, complex numbers, and/or electronic objects having multiple properties or sub-types. Data items may be nested, self-referential, and/or may include references to other data items. For example, the initial data set 12 may include a list of numbers, a list of objects each of which comprises a list of numbers, and so on. While some of the examples described herein refer specifically to predicting information about individuals given their personal attributes and/or circumstances, it should be appreciated that the techniques described herein are applicable to any domain to which predictive modeling techniques are applicable (e.g., predicting the likelihood/risk of a future accident or other occurrence, predicting a particular process measurement, predicting an existing consumer preference, etc.). It is understood that the term "prediction," as used herein, may refer to estimation of a future event/state/value/etc., or may refer to estimation of a current (or even a past) event/state/value/etc., depending upon the embodiment and/or scenario.

The expansion operation performed by the data expansion unit 14 comprises enlarging the initial data set 12 to generate the unlabeled simulated data set 16, where the initial data set 12 includes a first plurality of fact sets and the simulated data set 16 includes a second, larger plurality of fact sets used for training. As used herein, "expanded" or "expanding" denotes a process by which the simulated data set 16 comprises a larger data set than the initial data set 12. However, the second plurality of fact sets may or may not include the first plurality of fact sets. That is, the simulated data set 16 may or may not be a superset of the initial data set 12.

Data expansion unit 14 may use a distance function and/or other techniques to generate the unlabeled simulated data set 16. In general, a distance function may define how "close" two data points are. "Closeness" may be defined differently, according to various embodiments. For example, to continue the above example in which income is predicted given a number of facts about a person (e.g., age, educational attainment, etc.), a distance function may be configured such that each hypothetical person is separated in age by a specific number of months or years. Put differently, the data expansion unit 14 may create each fact set (each corresponding to a different hypothetical person) within the simulated data set 16 such that each hypothetical person is separated from the previous person and the next person by (for example) six months. In another embodiment, the distance function may be combined with another function, such as a step function or sigmoid function, to determine one or more attributes of the individual fact sets corresponding to different hypothetical people. It should be noted that different distance functions may determine different attributes of each fact set (e.g., age may be determined by a first distance function and location by a second distance function). In some embodiments, however, the data expansion unit 14 does not utilize distance functions to generate the simulated data set 16, and instead utilizes other techniques known in the art.

The data expansion unit 14 may generate the simulated data set 16 such that the distribution of the types (e.g., categories) of facts within the fact sets of the simulated data set 16 matches the distribution of the corresponding fact types within the fact sets of the initial data set 12. Alternatively, some of or all of the distributions may be intentionally skewed. For example, the data expansion unit 14 may determine a shape or distribution of ages indicated by 1,000 fact sets (in the initial data set 12) corresponding to 1,000 actual, real-world people. The data expansion unit 14 may then, based on the determined shape or distribution, generate 1,000,000,000 fact sets corresponding to 1,000,000,000 hypothetical people, where the statistical distribution(s) of one or more fact types (e.g., age or zip code) are consistent between the initial data set 12 and the simulated data set 16. Alternatively, the data expansion unit 14 may skew the distribution of one or more types of facts in the simulated data set 16 relative to the initial data set 12. For example, in an embodiment, the data expansion unit 14 may determine that a certain percentage of fact sets in the initial data set 12 have a fact type whose value is within a particular range (e.g., 5% of the represented people are 21 years of age). The data expansion unit 14 may then generate the fact sets of the simulated data set 16 such that a much larger or smaller percentage of people are age 21 (e.g., 50% of fact sets indicate a person 21 years of age). In other embodiments or scenarios, the distributions are deliberately skewed with respect to a combination of individual facts. For example, the initial data set 12 may indicate that only 0.1% of the represented people are over age 60, have a graduate degree, have one or more children, and have never been married, while the data expansion unit 14 may cause the simulated data set 16 to indicate that 3% of the hypothetical people satisfy all those criteria.

The degree to which a particular distribution is skewed may be a user-configurable factor, may be set randomly or pseudo-randomly, or may be set using a predetermined distribution. The data expansion unit 14 may skew the distributions of different fact types (or different combinations of fact types) in the same manner, or in different ways, in various different embodiments. For example, in one embodiment and scenario, ages may be generated according to a consistent distribution, whereas zip codes may be generated such that the distribution is skewed relative to the initial data set 12.

In the embodiment of FIG. 1, a labeled data set 18 is generated by predicting the unlabeled, simulated data set 16 using a trained, complex model 20 that outputs a first plurality of labels 22. As used herein, "predicting" a data set denotes applying the data set as input to a model (e.g., a neural network), or to a combination of models, to generate one or more outputs/predictions. Generally, this may occur during the training of a model (e.g., if a number of intermediate outputs/predictions are generated and compared to known labels, in order to tune the model parameters appropriately), and may also occur during operation of the trained model.

The complex model 20 may be an artificial neural network (also referred to herein as simply a "neural network") or another machine learning structure comprising multiple layers, sub-layers, and/or intermediate representations. However, the complex model 20 need not use machine learning techniques or algorithms, so long as the complex model 20 is capable of accepting the simulated data set 16 as input and producing the labels 22. Moreover, the complex model 20 may be either a single model or a combination of sub-models, and may be a pre-existing model or a model created for the specific purpose of generating the labeled data set 18. In some embodiments, the complex model 20 is a model that was trained using the initial data set 12, or a subset or superset thereof.

The labels 22 (i.e., the predictions output by the complex model 20 when predicting simulated data set 16) are "labels" in the sense that they are used as labels/classifiers for the fact sets of simulated data set 16. The labels 22 may include precise quantitative outputs (such as dollar values, percentages, binary outputs, integers, etc.), relative outputs ("faster," "slower," etc.), and/or other types of outputs.

In the embodiment of FIG. 1, a neural network training unit 24 uses the labeled data set 18 to train a compressed model 26 associated with a plurality of training parameters 28. For example, the training parameters 28 may include respective weightings of the input parameters, and possibly of intermediate values that are output by one or more layers of the compressed model 26. Such weightings may include one or more weights equal to (or very close to) zero if a particular input or intermediate value is not useful to the process of generating a prediction approximating the corresponding complex model 20.

As a part of this training, the untrained compressed model 26 analyzes the facts of the labeled data set 18 (i.e., the fact sets of the labeled data set 18), and the prediction comparison unit 32 compares intermediate predictions 30 generated/output by the analysis to the labels 22. These comparisons may be used to produce a measure (or measures) of accuracy, and a parameter update unit 34 may update the training parameters 28 based on the measure(s) of accuracy. The neural network training unit 24 may perform any suitable number of iterations (i.e., analyzing the facts of the labeled data set 18, comparing the intermediate predictions 30 to the labels 22, and then modifying the training parameters 28) until the intermediate predictions 30 match the labels 22 within some desired margin of error, at which point the compressed model 26 may be fully trained. During these successive iterations, the parameter update unit 34 may update the training parameters 28 based on a pre-determined algorithm, or may use random parameters to "fuzz" the training process, for example. In some embodiments, the neural network training unit 24 may be allowed to continue the training process until a pre-defined level of accuracy has been reached (e.g., more than 65%, or 99.9999%, etc.).

The compressed model 26 may be any suitable type of neural network, such as a convolutional neural network, recurrent neural network, or feedforward neural network, for example. The neural network may include a number (e.g., hundreds or thousands) of nodes or "neurons" arranged in multiple layers, with each neuron processing one or more inputs (e.g., from the preceding layer, if any) to generate a decision or other output. Once fully trained in this manner, the compressed model 26 may have an accuracy that is comparable to the accuracy of the complex model 20. The degree to which the accuracy of the compressed model 26 replicates the accuracy of the complex model 20 may be configurable. For example, the degree of approximation may depend upon a configurable margin of error that is used by the neural network training unit 24 when assessing the measure of accuracy after each iteration, and/or may depend upon the degree to which the data expansion unit 14 expanded the initial data set 12 when generating the simulated data set 16. Generally, a smaller margin of error, and/or a larger labeled data set 18, will result in a better approximation of the accuracy of the complex model 20.

Figure 2:
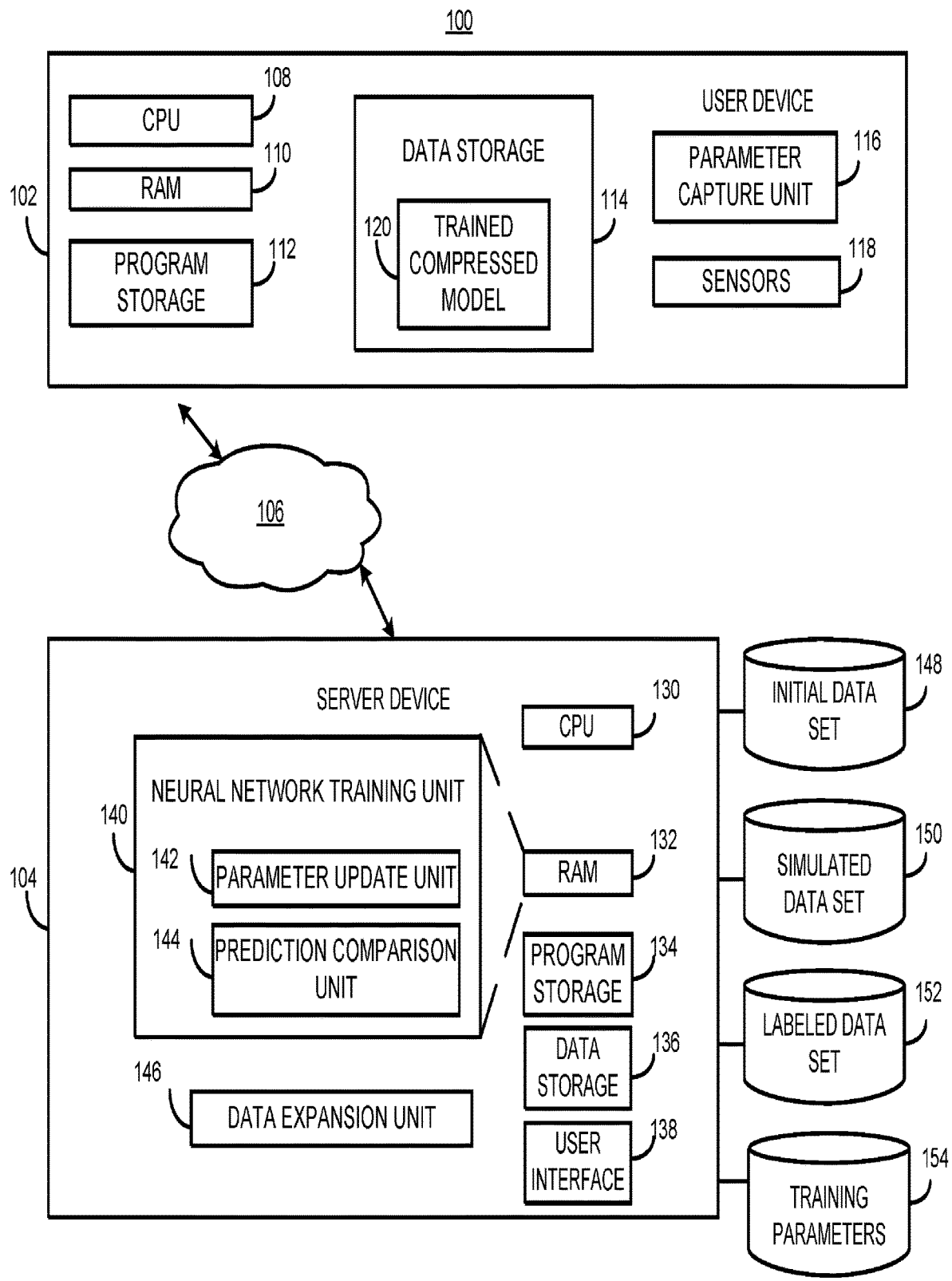
FIG. 2 depicts an example environment in which the process of FIG. 1 may be implemented, and in which compressed models may be deployed to a user device, according to an embodiment.

FIG. 2 depicts an example environment 100 in which the process 10 of FIG. 1 may be implemented. The environment 100 includes a user device 102 and a server device 104. The user device 102 and the server device 104 are communicatively coupled via a network 106, in the depicted embodiment. The server device 104 may host services relating to neural network training, which may be accessed/utilized by the user device 102. While FIG. 2 shows only a single user device 102, it is understood that multiple different user devices (of different entities and/or users), each similar to the user device 102, may be in remote communication with the server 104 via the network 106 and/or one or more other networks. The network 106 may be a single communication network, or may include multiple communication networks of one or more types (e.g., one or more wired and/or wireless local area networks (LANs), and/or one or more wired and/or wireless wide area networks (WANs) such as the Internet). The network 106 may comprise any type or types of suitable network(s).

The user device 102 may be a laptop computer, desktop computer, tablet, smartphone, wearable device, or any other suitable type of personal and/or mobile computing device. Alternatively, the user device 102 may be a relatively "dumb" node or terminal, such as an IoT device with little memory and/or processing power. The user device 102 may include a central processing unit (CPU) 108. While referred to in the singular, the CPU 108 may include any suitable number of processors of one or more types (e.g., one or more CPUs, graphics processing units (GPUs), cores, etc.). In the embodiment of FIG. 2, the user device 102 may also include a random access memory (RAM) 110, a program storage 112, a data storage 114, a parameter capture unit 116, and one or more sensors 118. The data storage 114 may include one or more persistent memories (e.g., a hard drive and/or solid state memory) and may store data used by and/or output by one or more applications, including a trained compressed model 120. In some embodiments, the trained compressed model 120 may include runtime code. The trained compressed model 120 may access other data in the data storage 114 as needed.

Generally, the CPU 108 may be configured to execute software instructions stored in the program storage 112, which may be loaded into the RAM 110. The program storage 112 may contain software instructions used to launch, initialize, and/or execute the trained compressed model 120. The software instructions may access (i.e., read data from and/or write data to) the data storage 114 and the parameter capture unit 116 as needed. Portions of the software instructions and/or data may be loaded into the RAM 110 when the CPU 108 executes the software instructions. For example, the trained compressed model 120 may be loaded into the RAM 110 when the compressed model 120 is launched by the software instructions in program storage 112.

Further, the software instructions may load data generated by the sensors 118 into the RAM 110 and may store data in the data storage 114. Each of the sensors 118 may be configured to detect and convey physical measurement data, including without limitation: photographic (video or still images), infrared, speed, temperature, audio, acceleration, humidity, atmospheric pressure, and/or other physical measurement data. For instance, the sensors 118 may include one or more microphones to capture audio data. In some embodiments, the sensors 118 may be configured to collect vehicle data (e.g., telematics data). For example, the vehicle data may include speed, position, heading, turning, acceleration, brake status, and/or other driving or driving behavior data. Data collected by the sensors 118 may be used to predict one or more variables of interest. It should be appreciated that many useful combinations of sensors and trained compressed models are envisioned, and that many data sources may be available via device sensors. Moreover, in some embodiments, the user device 102 instead (or also) collects and/or generates non-sensor data in order to predict one or more variables of interest.

The sensors 118 may generate digital data in a standard file encoding and/or compressed file format, and may capture data automatically or upon request. One or more of the sensors 118 may be synchronized (e.g., a first sensor may collect audio data and a second sensor may collect corresponding video data). The sensors 118 may all be integrated on and/or within the user device 102. Alternatively, one, some, or all of the sensors 118 may be external and communicatively coupled to the user device 102.

The server device 104 may be located remotely from the user device 102, and the server device 104 may be an individual server, or may include a group or cluster of multiple servers. The server device 104 may be operated in a cloud computing and/or virtualized computing environment. Like the user device 102, the server device 104 may contain a CPU 130, which includes one or more processors, and a RAM 132. Additionally, the server device 104 may include a program storage 134, in which software instructions may be stored, and a data storage 136 to which data may be written and from which data may be read, including data from either the server device 104 and/or the user device 102. The server device 104 may also include a user interface 138 that a user may use to access the server device 104.

In the embodiment of FIG. 2, the server device 104 also includes a neural network training unit 140 comprising a parameter update unit 142 and a prediction comparison unit 144. The server device 104 may further comprise a data expansion unit 146. Generally, the neural network training unit 140 may be used to train compressed models, and the parameter update unit 142 may be used to refresh training parameters and transmit the training parameters to user devices such as the user device 102. The prediction comparison unit 144 is generally responsible for keeping track of labels output by one or more complex models and intermediate predictions output by corresponding compressed models, and for comparing the corresponding labels and intermediate predictions. The data expansion unit 146 is generally responsible for loading data from relatively small data sets, identifying information pertaining to the distribution of the data therein, and expanding the smaller data sets into larger sets of data. Any of the foregoing units may be implemented in separate threads or processes on the server device 104.

For the particular scenario illustrated in FIG. 2, the server device 104 may store or access an initial data set 148, a simulated data set 150, a labeled data set 152, and training parameters 154, which may respectively correspond to the initial data set 12, the simulated data set 16, the labeled data set 18, and the training parameters 28 of the example process 10 shown in FIG. 1, or may correspond to different suitable data sets. Each of the initial data set 148, the simulated data set 150, the labeled data set 152, and the training parameters 154 may be stored in one or more persistent memories. For example, each may be stored in the data storage 136, or in one or more other persistent memories (e.g., in electronic databases) that are at the same location as the server 104 and/or at locations distributed across a large geographic area.

In operation, the server device 104 may first expand initial data, by the data expansion unit 146 loading the initial data set 148. The initial data set 148 may be analyzed by the data expansion unit 146 identifying one or more distributions of data comprising the initial data set. For example, as discussed above with respect to FIG. 1, distance functions may be used, and some level of skewness may be introduced. The goal of doing so may be to produce "edge cases." The expanded data based on the initial data set 148 may be stored as the simulated data set 150 by the data expansion unit 146. After the simulated data set 150 is populated, the compressed model may be trained by the neural network training unit 140 predicting the fact sets of the labeled data set 152, as discussed above with respect to FIG. 1 (i.e., the fact sets previously produced by a complex model).

The training may include the neural network training unit 140 training a compressed model by predicting the entire labeled data set 152. Alternately, a plurality of server devices may be configured to train the compressed model in parallel via distributed analysis. For example, the server device 104 may divide the fact sets from the labeled data set 152 into fact subsets, and propagate the fact subsets to a plurality of different, networked computing devices (not depicted in FIG. 2) via the network 106. In this case, each of the plurality of networked computing devices may respectively analyze the subset or "chunk" of the fact subsets the respective networked computing device is given using its own copy of a compressed model, to predict the portion of the labeled data set corresponding to the chunk of fact subsets. The output produced may correspond to either a final prediction or an intermediate prediction. By processing chunks, and then collating the resulting trained model, the process of training the compressed model 120 can be effectively parallelized, greatly speeding up the amount of time needed to create the compressed model 120.

As examples, the compressed model 120 may be a model that predicts the likelihood of a vehicular accident based on braking data, acceleration data, cornering data, and/or sensor data indicative of an environment external the vehicle, or a model that predicts whether a smart appliance is currently in need of repair based on various operational parameters. Generally, in these and other embodiments or scenarios, it may be desirable to store and use a local copy of the compressed model 120 at the user device 102 in order to, e.g., enable faster processing without the consumption of processing resources at the server device 104 (which may otherwise need to run many instances of the model 120 using data collected from many different user devices), avoid the latencies of communications with the server device 104 via the network 106, and/or avoid problems due to outages of the communication link established via the network 106. Thus, the server device 104 may transmit the trained compressed model 120 to the user device 102 via the network 106.

Once the server device 104 has trained compressed model 120, the parameter update unit 142 of the server device 104 may send training parameters to the parameter capture unit 116 of the user device 102 via the network 106. Having both a trained model and training parameters, the user device 102 may then initialize the trained compressed model 120 using the training parameters. The initialization of the trained compressed model 120 may effectively overwrite an existing compressed model that is contained within the user device 102 and/or the data storage 114, e.g., if the compressed model 120 is an update to an existing model. In some cases, more than one compressed model may be simultaneously stored and/or executed within the user device 102. The user device 102 may receive the trained compressed model 120 along with training parameters, or only the compressed model, or only the training parameters. In this way, incremental updates may be pushed from the server device 104 to the user device 102, and the process of transferring and running models is highly flexible.

The trained compressed model 120 may, while executing, be represented in the program storage 112 of the user device 102 and/or in the RAM 110. The parameter capture unit 116 may read or receive data from the sensors 118, either via the data storage 114 or directly, and may be capable of passing the sensor data (or a modified version thereof) as input parameters to the trained compressed model 120. While FIG. 2 depicts an embodiment wherein the user device 102 is provided in a networked environment, it should be understood that other embodiments are possible. For example, as noted above, a network connection is not necessary in some embodiments for the trained compressed model 120 to be executed in the user device 102. The trained compressed model 120 may execute asynchronously in the user device 102, and only contact the server device 104 periodically (e.g., when the user device 102 detects that a network connection is available), or never. There may be benefits realized by adding a third component to act as an intermediary between the user device 102 and the server device 104. For example, an intermediary may be used for the purposes of authentication, load balancing, caching, and so forth. Moreover, in some embodiments and/or scenarios, the trained compressed model 120 may instead be used/applied solely at the server device 104 (e.g., using input parameters received from the user device 102 and/or other devices).

Figure 3A:
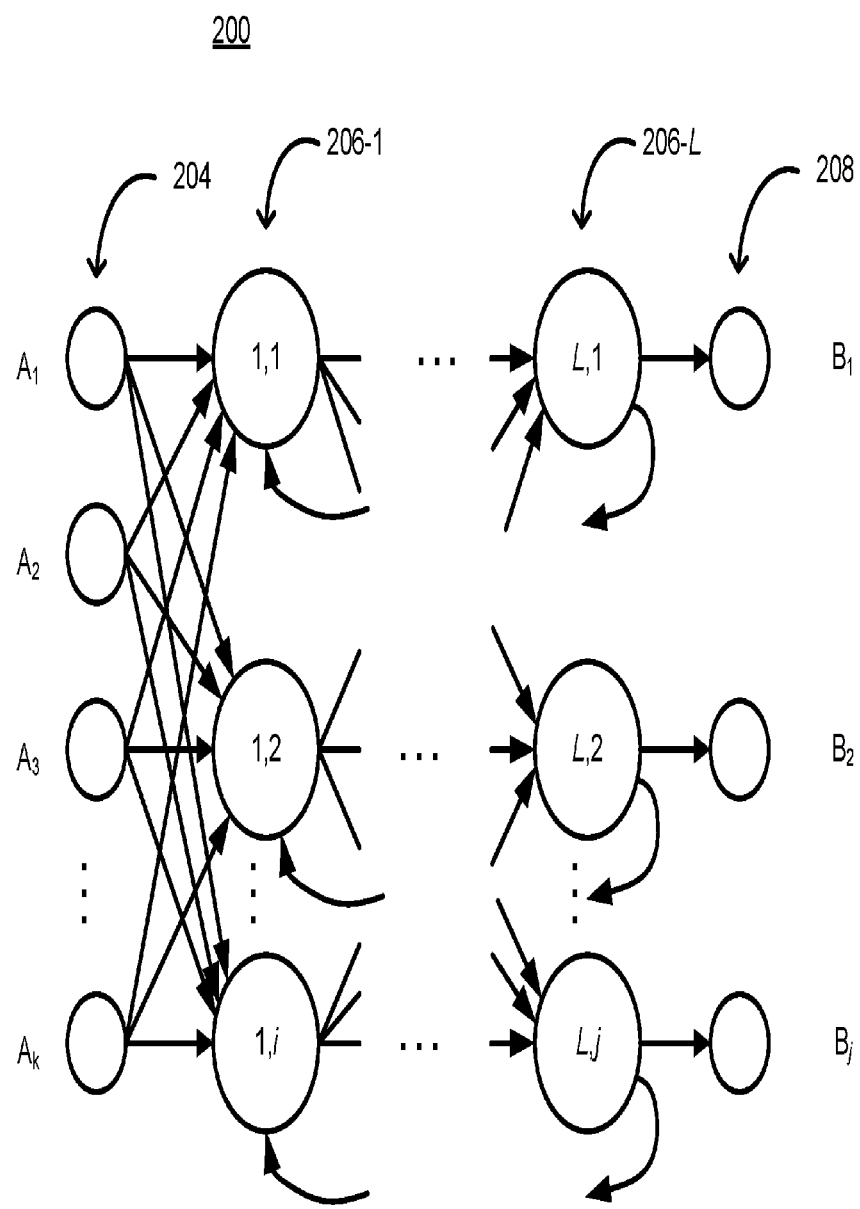
FIG. 3A depicts an example neural network used to make predictions, according to one embodiment and scenario.

FIG. 3A depicts an example neural network 200 that may correspond to the compressed model 26 of FIG. 1 and/or the trained compressed model 120 of FIG. 2, for example. The example neural network 200 includes an input layer 204, one or more hidden layers 206-1 through 206-L, and an output layer 208. Each of the layers in the example neural network 200 may include an arbitrary number of neurons. Therefore, i and j in FIG. 3A may be any positive integers. Both the plurality of neural network layers 206-1 through 206-L and the individual neurons therein may be configured in different ways. The neurons may be chained together linearly as shown and pass output from one to the next, or may be networked together such that the neurons communicate input and output in a non-linear way. In general, it should be understood that many configurations and/or connections different from those shown in FIG. 3A are possible.

In an embodiment, the input layer 204 may correspond to input parameters that are numerical facts, such as the age and/or number of years of work experience of a person, or to other types of data such as data from the sensors 118, as discussed above with respect to FIG. 2. The input layer 204 may correspond to a large number of input parameters (e.g., one million inputs), in some embodiments, and may be analyzed serially or in parallel. Further, various neurons and/or neuron connections within the neural network 200 may be initialized with any number of weights and/or other training parameters, e.g., as depicted in FIG. 3B (discussed further below).

Each of the neurons in the hidden layers 206-1 through 206-L may analyze one or more of the input parameters from the input layer 204, and/or one or more outputs from a previous one or more of the hidden layers, to generate a decision or other output. The output layer 208 may include one or more outputs, each indicating a prediction. In some embodiments and/or scenarios, the output layer 208 includes only a single output (e.g., a number representing a person's predicted/estimated yearly income).

In some embodiments, feedback from a subsequent or previous neuron may be used to identify neurons that are of lesser relevance to the determination of the trained outputs of the neural network 200. Further, once the neural network 200 is trained, some useless (or less useful) neurons may be bypassed entirely to optimize the resource consumption of the neural network 200 and/or to improve the predictive capabilities of the neural network 200.

Figure 3B:
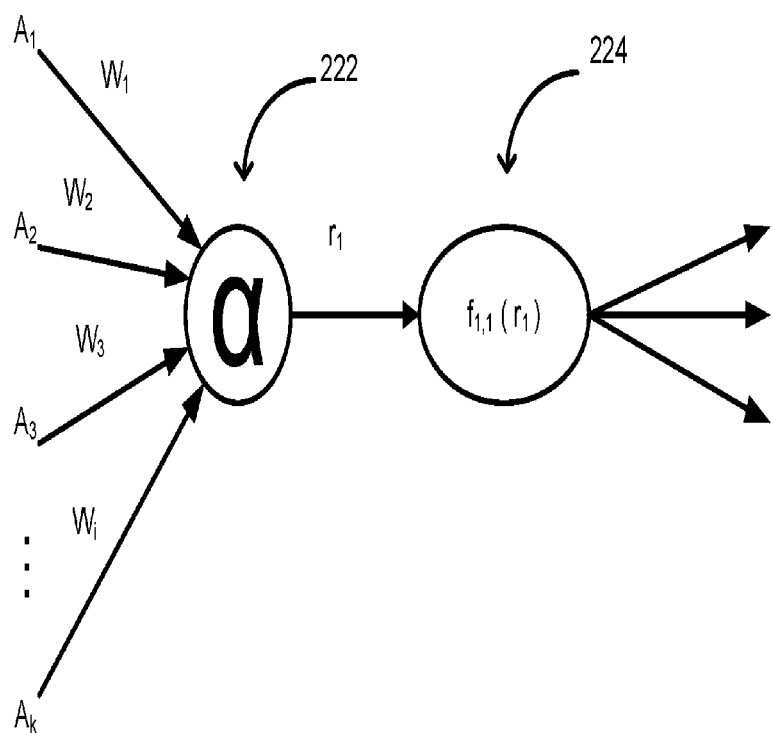
FIG. 3B depicts an example neuron associated with the neural network depicted in FIG. 3A, according to one embodiment and scenario.

FIG. 3B depicts an example neuron 220 that may correspond to one of the neurons in the hidden layers 206-1 through 206-L in FIG. 3A, in an embodiment. For example, the neuron 220 may correspond to the neuron in FIG. 3A labeled "1,2." Each of the inputs to the neuron 220 may be weighted according to a set of weights $W_1$ through $W_j$, determined during the training process (for example, if the neural network 200 is a recurrent neural network) and then applied to a node 222 that performs an operation α. The operation α may include computing a sum, a difference, a multiple, or a different operation. In some embodiments weights are not determined for some inputs, notwithstanding the fact that FIG. 3B depicts all inputs $A_1$ through $A_k$ as being associated with a weight. Further, the neuron 220 may not consider some inputs as relevant to the determination of outputs, and may thus ignore them (e.g., by setting the respective weight to zero).

The sum of the weighted inputs, $r_1$, may be input to a function 224, labeled in FIG. 3B as $f_{1,1}(r_1)$ which may represent any suitable functional operation on $r_1$. As depicted in FIG. 3B, the output of the function 224 may be provided to a number of neurons of a subsequent layer or as an output of the neural network 200.

It should be appreciated that in other embodiments or configurations, the neuron 220 may be arranged differently than the depiction in FIG. 3B. For example, the node 222 may be omitted and/or the function 224 may work directly with the inputs $A_1$ through $A_k$. There may be a lack of any weighting, and the operation α may comprise a transforming function, such as taking an absolute value or conversion to a natural number, for example.

The exact manner in which the neural network 200 constitutes and uses layers, and neurons within the layers, may vary depending on the nature of the input data and/or the desired training and output. The structure of the individual layers and/or neurons, including without limitation the type, number, weightings, and so on, may affect the manner in which the overall neural network 200 functions. However, for the sake of clarity some relatively straightforward/simple examples are discussed herein.

Figure 4:
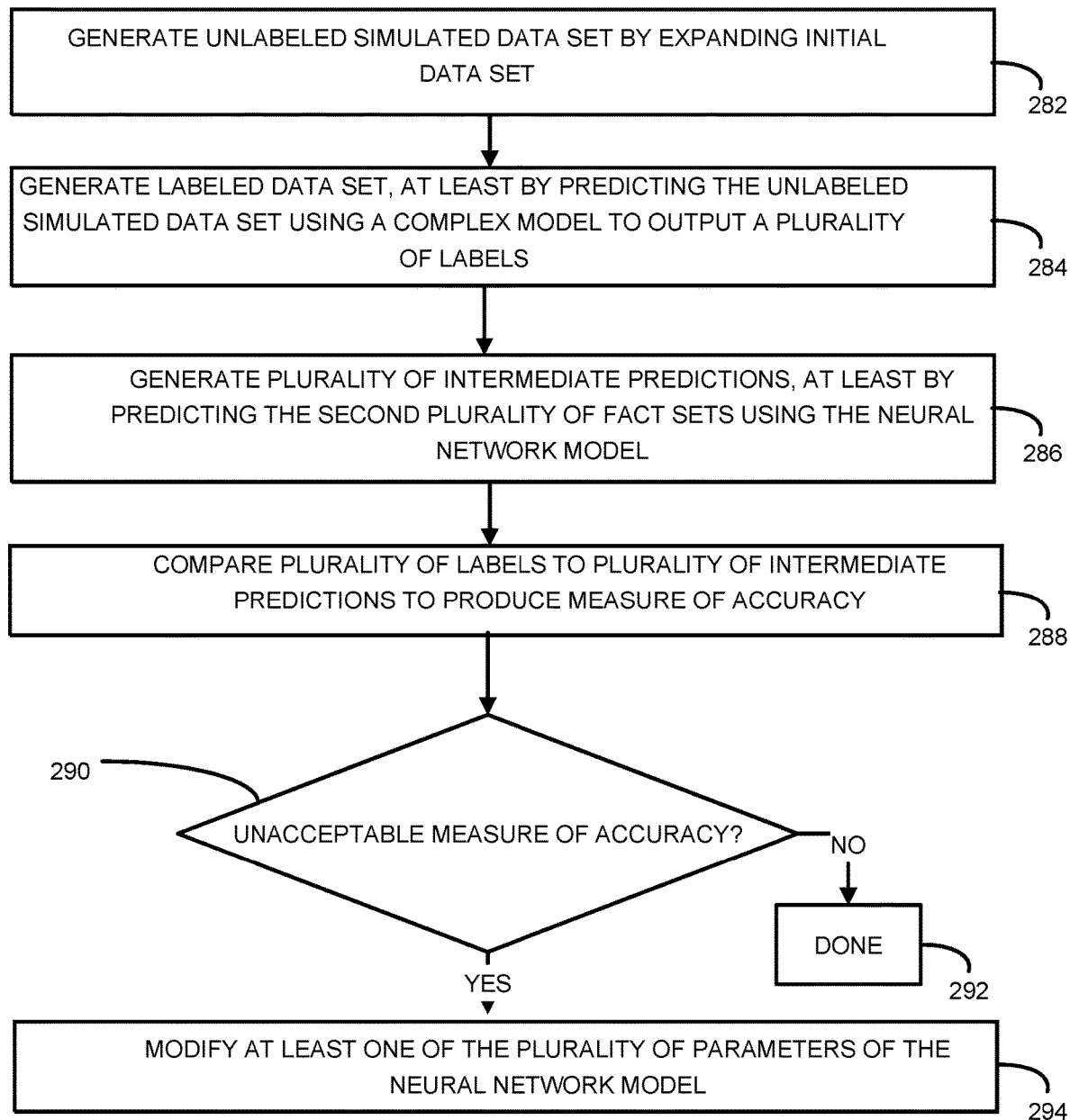
FIG. 4 is a flow diagram of an example method for compressing predictive models.

FIG. 4 is a flow diagram of an example method 280 for compressing a complex model. The method 280 may be implemented by one or more processors of a computing device or system, such as the CPU 130 of the server device 104 in FIG. 2.

In the method 280, an unlabeled simulated data set is generated by expanding an initial data set (block 282). A labeled data set may be generated (block 284) by predicting the unlabeled simulated data set using a complex model (e.g., the complex model 20 of FIG. 1). Thereafter, a neural network model may be trained using the labeled data set. Training the neural network may include determining associated parameters, such as weights that correspond to input parameters and/or to outputs of various neurons of the neural network. As discussed above, in some embodiments, the neural network may be trained and/or used to produce predictions in a distributed context that comprises intermediate and/or final predictions.

As a part of the training process, a plurality of intermediate predictions is generated by predicting a second plurality of fact sets using a neural network model (block 286). The neural network may be a recurrent neural network, convolutional neural network, or other type of neural network. The neural network may be relatively simple, such as a neural network that includes only one or more neurons in a single layer, or only a small number of layers, for example.

The plurality of labels is compared to the plurality of intermediate predictions to produce a measure of accuracy (block 288). For example, if the variable being predicted is yearly income, with the complex model predicting $100,000 and the neural network model predicting $99,000, then the measure of accuracy may be calculated as a 1% deviation (e.g., as measured by the prediction comparison unit 32 of FIG. 1 and/or the prediction comparison unit 144 of FIG. 2). It should be understood that more complex comparisons are also envisioned, and that the comparison may involve the comparison of pluralities rather than single numbers as described in the foregoing example for the sake of simplicity.

The measure of accuracy is analyzed to determine whether it is acceptable or unacceptable (block 290). If the measure of accuracy is acceptable, the method 280 may proceed to block 292, at which point the training of the neural network model may be deemed to be complete. If the measure of accuracy is unacceptable, then the method 280 may proceed to block 294, at which point at least one of the plurality of parameters (e.g., weights) of the neural network model may be modified. It should be understood that "acceptable" may be defined differently depending on context, embodiment, and/or scenario. For example, a one percent difference may be perfectly acceptable in estimating yearly income, but not acceptable in other implementations or scenarios.

Additional Considerations

With the foregoing, any users (e.g., insurance customers) whose data is being collected and/or utilized may first opt-in to a rewards, insurance discount, or other type of program. After the user provides their affirmative consent, data may be collected from the user's device (e.g., mobile device, smart vehicle controller, or other smart devices). Of course, local storage and use of a compressed model at a user device (e.g., the user device 102 of FIG. 2) may have the benefit of removing any concerns of privacy or anonymity, by removing the need to send any personal or private data to a remote server (e.g., the server device 104 of FIG. 2). In such instances, there may be no need for affirmative consent.

Although the text herein sets forth a detailed description of numerous different embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based upon any statement made in any section of this patent (other than the language of the claims). To the extent that any term recited in the claims at the end of this disclosure is referred to in this disclosure in a manner consistent with a single meaning, that is done for sake of clarity only so as to not confuse the reader, and it is not intended that such claim term be limited, by implication or otherwise, to that single meaning. Unless a claim element is defined by reciting the word "means" and a function without the recital of any structure, it is not intended that the scope of any claim element be interpreted based upon the application of 35 U.S.C. § 112(f). The systems and methods described herein are directed to an improvement to computer functionality, and improve the functioning of conventional computers.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (code embodied on a non-transitory, tangible machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more modules of a computer system (e.g., a processor or a group of processors) may be configured by software (e.g., an application or application portion) as a module that operates to perform certain operations as described herein.

In various embodiments, a module may be implemented mechanically or electronically. Accordingly, the term "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which modules are temporarily configured (e.g., programmed), each of the modules need not be configured or instantiated at any one instance in time. For example, where the modules comprise a general-purpose processor configured using software, the general-purpose processor may be configured as respective different modules at different times. Software may accordingly configure a processor, for example, to constitute a particular module at one instance of time and to constitute a different module at a different instance of time.

Modules can provide information to, and receive information from, other modules. Accordingly, the described modules may be regarded as being communicatively coupled. Where multiple of such modules exist contemporaneously, communications may be achieved through signal transmission (e.g., over appropriate circuits and buses) that connect the modules. In embodiments in which multiple modules are configured or instantiated at different times, communications between such modules may be achieved, for example, through the storage and retrieval of information in memory structures to which the multiple modules have access. For example, one module may perform an operation and store the output of that operation in a memory device to which it is communicatively coupled. A further module may then, at a later time, access the memory device to retrieve and process the stored output. Modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information. Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein any reference to "one embodiment" or "an embodiment" means that a particular element, feature, structure, or characteristic described in connection with the embodiment may be included in at least one embodiment. The appearances of the phrase "in one embodiment" in various places in the specification are not necessarily all referring to the same embodiment. In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

This detailed description is to be construed as exemplary only and does not describe every possible embodiment, as describing every possible embodiment would be impractical, if not impossible. One could implement numerous alternate embodiments, using either current technology or technology developed after the filing date of this application. Upon reading this disclosure, those of skill in the art will appreciate still additional alternative structural and functional designs for compressing a complex model through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The particular features, structures, or characteristics of any specific embodiment may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

While the preferred embodiments of the invention have been described, it should be understood that the invention is not so limited and modifications may be made without departing from the invention. The scope of the invention is defined by the appended claims, and all devices that come within the meaning of the claims, either literally or by equivalence, are intended to be embraced therein. It is therefore intended that the foregoing detailed description be regarded as illustrative rather than limiting, and that it be understood that it is the following claims, including all equivalents, that are intended to define the spirit and scope of this invention.

What is claimed:

1. A computer-implemented method comprising:
generating an unlabeled simulated data set by expanding an initial data set, the initial data set including a first plurality of fact sets and the unlabeled simulated data set including a second plurality of fact sets;
generating a labeled data set by predicting the unlabeled simulated data set using a complex model to output a plurality of labels, the labeled data set including the second plurality of fact sets and the plurality of labels;
generating a plurality of intermediate predictions by predicting the second plurality of fact sets using a neural network model;
comparing the plurality of labels to the plurality of intermediate predictions to determine a measure of accuracy; and
modifying at least one of a plurality of training parameters of the neural network model based upon the measure of accuracy.

2. The computer-implemented method of claim 1, further comprising:
training the neural network model iteratively until the measure of accuracy is within a predetermined threshold.

3. The computer-implemented method of claim 2, further comprising:
generating a graphical depiction of the trained neural network model.

4. The computer-implemented method of claim 2, further comprising:
receiving the trained neural network model in a computing device;
generating an unlabeled new data set based upon data collected by the computing device, the unlabeled new data set including a plurality of new fact sets; and generating a plurality of device predictions by predicting the unlabeled new data set using the trained neural network model.

5. The computer-implemented method of claim 2, further comprising:
sending the trained neural network model to a remote computing device to enable the remote computing device to analyze one or more unlabeled new data sets using the trained neural network model.

6. The computer-implemented method of claim 5, wherein sending the trained neural network model to the remote computing device includes sending the trained neural network model to a mobile device of a user.

7. The computer-implemented method of claim 1, wherein generating the unlabeled simulated data set by expanding the initial data set includes generating the unlabeled data set such that a distribution of a plurality of fact types within the second plurality of fact sets is skewed when compared to a distribution of a plurality of fact types within the first plurality of fact sets.

8. The computer-implemented method of claim 1, further comprising:
obtaining a definition of the plurality of training parameters of the neural network model from a remote database.

9. The computer-implemented method of claim 1, wherein generating the plurality of intermediate predictions includes:
dividing the second plurality of fact sets into fact subsets;
receiving, at each of a plurality of networked computing devices, one of the fact subsets;
generating, by each of the plurality of networked computing devices predicting a respective one of the fact subsets using the neural network model, a respective intermediate prediction; and
receiving, at a single networked computing device, the respective intermediate prediction corresponding to each of the fact subsets.

10. A computing system comprising:
one or more processors; and
one or more memories storing instructions that, when executed by the one or more processors, cause the computing system to:
generate an unlabeled simulated data set by expanding an initial data set, the initial data set including a first plurality of fact sets and the unlabeled simulated data set including a second plurality of fact sets;
generate a labeled data set by predicting the unlabeled simulated data set using a complex model to output a plurality of labels, the labeled data set including the second plurality of fact sets and the plurality of labels;
generate a plurality of intermediate predictions by predicting the second plurality of fact sets using a neural network model;
compare the plurality of labels to the plurality of intermediate predictions to determine a measure of accuracy; and
modify at least one of a plurality of training parameters of the neural network model based upon the measure of accuracy.

11. The computing system of claim 10, wherein the instructions further comprise instructions that, when executed by the one or more processors, cause the computing system to train the neural network model iteratively until the measure of accuracy is within a predetermined threshold.

12. The computing system claim 11, wherein the instructions further comprise instructions that, when executed by the one or more processors, cause the computing system to generate a graphical depiction of the trained neural network model.

13. The computing system of claim 11, further comprise instructions that, when executed by the one or more processors, cause the computing system to send the trained neural network model to a remote computing device to enable the remote computing device to analyze one or more unlabeled new data sets using the trained neural network model.

14. The computing system of claim 13, wherein the remote computing device is a mobile device of a user.

15. The computing system of claim 10, wherein the instructions that cause the computing system to generate the unlabeled data set by expanding the initial data set further comprise instructions that cause the computing system to generate the unlabeled data set such that a distribution of a plurality of fact types within the second plurality of fact sets is skewed when compared to a distribution of a plurality of fact types within the first plurality of fact sets.

16. The computing system of claim 10, further comprise instructions that, when executed by the one or more processors, cause the computing system to obtain a definition of the plurality of training parameters of the neural network model from a remote database.

17. A non-transitory computer readable medium storing instructions that, when executed by at least one processor of a computing device, cause the computing device to:
generate an unlabeled simulated data set by expanding an initial data set, the initial data set including a first plurality of fact sets and the unlabeled simulated data set including a second plurality of fact sets;
generate a labeled data set by predicting the unlabeled simulated data set using a complex model to output a plurality of labels, the labeled data set including the second plurality of fact sets and the plurality of labels;
generate a plurality of intermediate predictions by predicting the second plurality of fact sets using a neural network model;
compare the plurality of labels to the plurality of intermediate predictions to determine a measure of accuracy; and
modify at least one of a plurality of training parameters of the neural network model based upon the measure of accuracy.

18. The non-transitory computer readable medium of claim 17, further comprising instructions that, when executed by the at least one processor, cause the computing device to train the neural network model iteratively until the measure of accuracy is within a predetermined threshold.

19. The non-transitory computer readable medium of claim 18, wherein the instructions when executed by the at least one processor that cause the computing device to generate the unlabeled data set by expanding the initial data set further cause the computing device to generate the unlabeled data set such that a distribution of a plurality of fact types within the second plurality of fact sets is skewed when compared to a distribution of a plurality of fact types within the first plurality of fact sets.

20. The non-transitory computer readable medium of claim 18, further comprising instructions that, when executed by the at least one processor, cause the computing device to generate a graphical depiction of the trained neural network model.

* * * * *